(12) United States Patent
Vetter

(10) Patent No.: US 10,844,493 B2
(45) Date of Patent: Nov. 24, 2020

(54) HYDROGEN-FREE CARBON COATING HAVING ZIRCONIUM ADHESIVE LAYER

(71) Applicant: OERLIKON SURFACE SOLUTIONS AG, PFÄFFIKON, Pfäffikon (CH)

(72) Inventor: Joerg Vetter, Bergisch Gladbach (DE)

(73) Assignee: OERLIKON SURFACE SOLUTIONS AG, PFÄFFIKON, Pfäffikon (CH)

(*) Notice: Subject to any disclaimer, the term of this patent is extended or adjusted under 35 U.S.C. 154(b) by 179 days.

(21) Appl. No.: 16/080,401

(22) PCT Filed: Feb. 28, 2017

(86) PCT No.: PCT/EP2017/000270
§ 371 (c)(1),
(2) Date: Aug. 28, 2018

(87) PCT Pub. No.: WO2017/148582
PCT Pub. Date: Sep. 8, 2017

(65) Prior Publication Data
US 2019/0249310 A1 Aug. 15, 2019

Related U.S. Application Data

(60) Provisional application No. 62/301,656, filed on Mar. 1, 2016.

(51) Int. Cl.
*C23C 14/06* (2006.01)
*C23C 28/00* (2006.01)
(Continued)

(52) U.S. Cl.
CPC .......... *C23C 28/343* (2013.01); *C23C 14/024* (2013.01); *C23C 14/025* (2013.01);
(Continued)

(58) Field of Classification Search
USPC ................. 428/336, 408, 469, 472
See application file for complete search history.

(56) References Cited

U.S. PATENT DOCUMENTS 5,474,816 A * 12/1995 Falabella ............ C23C 14/0605
423/446
2003/0049083 A1* 3/2003 Ohtani .................. C23C 14/022
408/144

(Continued)

FOREIGN PATENT DOCUMENTS

CN 104988459 * 10/2015
DE 102007010595 A1 11/2007
(Continued)

OTHER PUBLICATIONS

Lin et al "Diamond like carbon films deposited by HiPIMS using oscillatory voltage pilses" Surfac & Coatings Technology 258 p. 1212-1222. (Year: 2014).*

(Continued)

*Primary Examiner* — Archene A Turner
(74) *Attorney, Agent, or Firm* — Polson Intellectual Property Law, PC; Margaret Polson; Christopher Sylvain

(57) ABSTRACT

The present disclosure relates to a coated substrate having a hard material coating, which comprises a hard carbon layer of the hydrogen-free amorphous carbon layer type, wherein the coating comprises a layer consisting of zirconium between the substrate and the hydrogen-free amorphous carbon layer; wherein between the layer consisting of zirconium and the hydrogen-free amorphous carbon layer, a layer consisting of $Zr-C_x$ can be formed in which a zirconium monocarbide is formed; and the layer consisting of $Zr-C_x$ and comprising zirconium monocarbide is applied directly to the adhesive layer consisting of zirconium.

17 Claims, 2 Drawing Sheets

(51) Int. Cl.
*C23C 28/04* (2006.01)
*C23C 14/02* (2006.01)

(52) U.S. Cl.
CPC ........ *C23C 14/027* (2013.01); *C23C 14/0605* (2013.01); *C23C 28/042* (2013.01); *C23C 28/044* (2013.01); *C23C 28/046* (2013.01); *C23C 28/32* (2013.01); *C23C 28/322* (2013.01); *C23C 28/341* (2013.01); *C23C 28/347* (2013.01); *C23C 28/42* (2013.01); *Y02T 50/60* (2013.01)

(56) References Cited

U.S. PATENT DOCUMENTS

| | | | |
|---|---|---|---|
| 2003/0129407 A1* | 7/2003 | Teer | C23C 14/0605 428/408 |
| 2015/0017468 A1 | 1/2015 | Lukitsch | |
| 2015/0292622 A1* | 10/2015 | Kennedy | F16J 9/28 277/442 |
| 2018/0018254 A1 | 1/2018 | Bansal et al. | |

FOREIGN PATENT DOCUMENTS

| | | |
|---|---|---|
| DE | 102012007796 A1 | 10/2013 |
| EP | 1266979 A2 | 12/2002 |
| EP | 2851451 A1 | 3/2015 |
| JP | 2004-137541 * | 10/2002 |

OTHER PUBLICATIONS

Kao "The tribological properties of Zr:C;H coatings deposted on AISI MS substrate" Wear 246 p. 368-373. (Year: 2008).*
Ronkainen et al "Differentiatiating the tribological performance of Hydrogenated and hydrogen-free DLC coatings" Wear 249 p. 260-266. (Year: 2001).*
Sarakinos et al "Exploring the potential of high power magnetron sputtering for growth of diamond-like carbonfilms" Surface & Coatings Technology 206 p. 2706-2710. (Year: 2010).*
International Search Report dated Dec. 6, 2017 in parent application PCT/EP2017/000270.
Written Opinion of the International Searching Authority dated Dec. 6, 2017 in parent application PCT/EP2017/000270.
M. D. Jean, "Optimisation of tribological performance of sputtering Zr/ZrC coatings", Surface Engineering, vol. 31. No. 2, Dec. 30, 2014, pp. 103-113. XP055377637. GB ISSN: 0267-0844. DOI: 10.1179/1743294414Y.0000000306.
Xin Chun Chen et al: "Cr-Doped DLC Multilayered Thin Films Deposited Using Cathodic Vacuum Arc- and DC Magnetron-Assisted Ion Beam Sputtering". Advanced Materials Research, vol. 105-106, Apr. 1, 2010, pp. 429-431. XP055373533. DOI: 10.4028/ www.scientific.net/AMR.105-106.429.

* cited by examiner

HYDROGEN-FREE CARBON COATING HAVING ZIRCONIUM ADHESIVE LAYER

BACKGROUND

The present disclosure relates to a hydrogen-free carbon (C) coating having a zirconium (Zr) adhesive layer for substrate surfaces, particularly for tool and component surfaces for tribological applications. The carbon coating can contain a hard carbon layer with a hydrogen-free amorphous carbon structure, which is referred to as a-C or as ta-C depending on the C—C $sp^3$ bond content and other elements, and is a member of the group of Diamond-Like Carbon (DLC) coatings. The zirconium adhesive layer consists of zirconium and is applied between the substrate surface and the hard carbon layer in such a way that atomic bonds form between the carbon atoms of the carbon layer and the zirconium atoms of the zirconium layer.

In the context of the present disclosure, "zirconium" should be understood to mean the chemical element with the element symbol Zr.

For the sake of simplicity, a $Zr_{1-x}C_x$ will be referred to as $Zr—C_x$. X therein expresses the at % and the following equations apply: 0 at %≤X≤50 at % and Zr (at %)+C (at %)=100 at %, without accounting for impurities. When X=0 at %, the adhesive layer is a pure zirconium layer. But the range of 10 at %≤X≤50 at % is preferable.

In the context of the present disclosure, a carbon layer should be understood to mean a layer that has a carbon matrix in the amorphous state that can be detected by means of volumetric measurement and can also be detected by means of Raman spectroscopy or another suitable method for measurement.

The zirconium layer serves as a coupling agent between the substrate and the hydrogen-free carbon layer. Depending on the process, atomic bonds form between the carbon atoms of the hydrogen-free layer and atoms of the zirconium layer. Under certain process conditions, depending on the process temperature and the energy with which the carbon atoms strike, a thin Zr-Cx layer can form between the layer consisting of zirconium and the hydrogen-free amorphous carbon layer.

It is also possible to selectively form zirconium monocarbide by depositing zirconium and carbon simultaneously, with the layer consisting of ZrC—possibly the layer comprising zirconium monocarbide—being deposited directly onto the adhesive layer consisting of zirconium. In another embodiment, the transition to the pure carbon layer can also be a multilayer or graduated hydrogen-free a-C:Zr coating or ta-C:Zr coating, which is distinguished from stoichiometric zirconium carbide by a larger atomic percentage of carbon atoms relative to zirconium atoms.

Amorphous, carbon-based hard material coatings, also referred to as DLC layers, are known from conventional practices. However, these types of layers do not always have sufficient adhesion to the substrate, particularly if the hydrogen-free layers are of the a-C or ta-C type. This is dictated by the high internal stress state of the layers, which is why it is difficult to achieve a stable process for depositing firmly bonded layers of this type with excellent functionality.

In this context, for example in DE102007010595B4, Kabushiki teaches that when a nitride or carbon nitride is used for the intermediate layer, the adhesion of the layer composed of amorphous carbon (also called Diamond-Like Carbon, or DLC) can be improved even at a high temperature or in a high-stress region. Kabushiki therefore proposes producing the adhesion between the substrate and the layer composed of amorphous carbon (DLC) by depositing a multilayer coating system between the substrate and the DLC coating of amorphous carbon. According to the teaching of Kabushiki, it is thus possible to improve the adhesion between the substrate and the DLC coating even at high temperature and in a high-stress region.

The multilayer coating system according to Kabushiki comprises:

a base layer that is produced on the substrate, which comprises a nitride or carbon nitride of an element M and has a composition according to the formula $M_{1-x-y}C_xN_y$, where x≤0.5, y≥0.03 and 1-x-y is greater than zero, M is at least one element selected from the groups 4A, 5A, and 6A of the periodic table, Aluminum (Al), and Silicon (Si), and where the element M comprises Titanium (Ti), Zr, Vanadium (V), Niobium (Nb), Tantalum (Ta), Chromium (Cr), Molybdenum (Mo), Tungsten (W), Al, and Si. Preferably, M comprises the elements W, Mo, and Ta, and a gradient layer that is produced on the base layer, which contains M, Nitrogen (N), and C, where from the base layer to an amorphous carbon layer on the gradient layer, the percentages of the element M and nitrogen decrease and the carbon percentage increases, and a surface layer that is formed on the gradient layer, which comprises an amorphous carbon layer that consists of carbon or of 50 atomic percent or more of carbon, with the rest consisting of the element M, and optionally also a layer of an element that is produced between the substrate and the base layer, it being possible for the element to be selected exclusively from an element in the groups 4A of the periodic system, an element in the group 5A, an element in the group 6A, and Al and Si.

However, the layer structure, as described above, is complex and therefore requires a complex reactive coating process, which is usually not desirable in industrial production, e.g. in mass production, because the complexity of the process steps constitutes a greater risk in regard to a sufficient coating result.

SUMMARY

Proceeding from the foregoing, an aspect of the present disclosure is to provide a hard material coating, which comprises a hard, hydrogen-free, amorphous carbon-based layer, in which the hard material coating has the simplest possible layer structure and sufficient adhesion to the substrate, even when applied in high-stress regions.

Another aspect of the present disclosure is to provide a coating process, which makes it possible to manufacture the coating in a simple way and with increased process stability.

According to the present disclosure, this embodiment is attained by providing a carbon coating of the kind disclosed in claim 1.

The carbon coating comprises a hard carbon layer and a zirconium adhesive layer; the carbon layer has a hard, hydrogen-free, amorphous carbon structure and the zirconium adhesive layer consists of zirconium. The zirconium adhesive layer is deposited between the substrate surface and the hard carbon layer in such a way that atomic bonds form between carbon atoms of the hard carbon layer and zirconium atoms of the zirconium adhesive layer. In this case, a thin zirconium and carbon-containing Zr-Cx layer forms, which has a layer thickness of a few atomic layers or up to a few nanometers.

DETAILED DESCRIPTION

Figure 1:
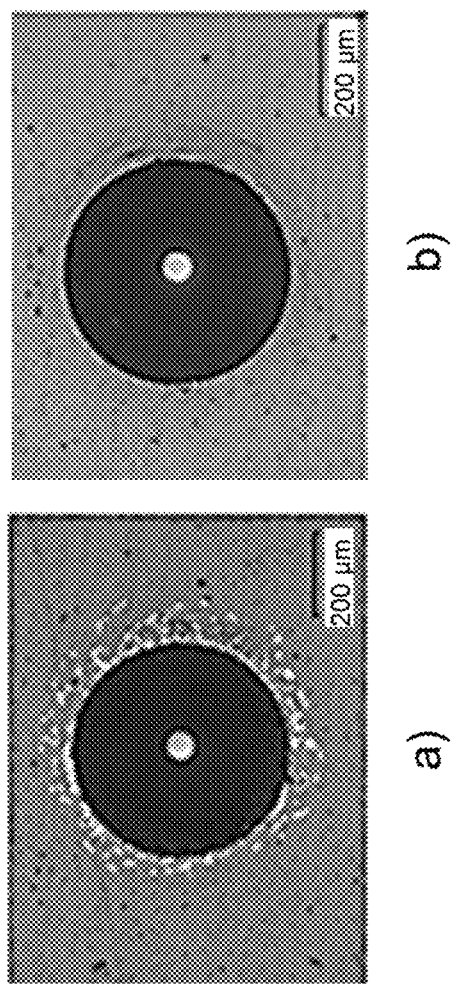
FIG. 1a) shows a photograph of a Rockwell C indentation in a carbon coating with a chromium adhesive layer.
FIG. 1b) shows a photograph of a Rockwell C indentation in a carbon coating according to the present disclosure.

In a first embodiment of the carbon coating according to the present disclosure, the Zr-Cx layer is formed exclusively by atomic bonds that form—depending on the process—between carbon atoms of the hard, hydrogen-free, amorphous carbon layer and zirconium atoms of the zirconium adhesive layer such that this Zr-Cx layer has a layer thickness in the atomic layer range. In this embodiment, the layer thickness of the Zr-Cx layer can, for example, be from 2 to 10 atomic layers.

In another embodiment of the carbon coating according to the present disclosure, process conditions are selected such that after depositing the zirconium adhesive layer, in particular the process temperature and energy of the carbon atoms striking the surface of the zirconium adhesive layer to promote the formation of atomic bonds between carbon atoms of the hard, hydrogen-free, amorphous carbon layer and zirconium atoms of the zirconium adhesive layer, the required conditions are present for the formation of a Zr-Cx layer with a layer thickness of from at least 2 atomic layers to approximately 100 nm.

In yet another embodiment of the carbon coating according to the present disclosure, a process is carried out in such a way that between the zirconium adhesive layer and the hard, hydrogen-free, amorphous carbon layer, a ZrC layer forms that contains zirconium monocarbide. The zirconium monocarbide-containing ZrC layer can be produced through the simultaneous deposition of zirconium and carbon. For example, the layer thickness of the zirconium monocarbide-containing ZrC layer in this embodiment is 5 nm to 500 nm.

According to another embodiment of the present disclosure, the hydrogen-free amorphous carbon layer is an a-C or ta-C layer.

The hydrogen-free carbon layers, referred to by the person skilled in the art as a-C coatings or ta-C coatings, can for example be deposited by means of arc (unfiltered or filtered) or sputtering (DC, pulsed DC, RF, or HiPIMS) methods, especially in the case of a-C coatings.

The term "a-C coatings" is used when the relative share of the sp$^3$ bond percentages of the C—C bonds is less than or equal to the share of sp$^2$ bond percentages of the C—C bonds in the layers. These layers then have hardnesses of less than 50 GPa. If the share of the sp$^3$ bond percentages exceeds that of the sp$^2$ bond percentages, then these are referred to as ta-C coatings (tetrahedral hydrogen-free amorphous carbon layers), which typically have hardnesses of greater than 50 GPa. Common methods that are known to the person skilled in the art for measuring the hardness of thin layers can also be used.

The zirconium adhesive layer can, for example, be deposited by means of arc (unfiltered or filtered) or sputtering (DC, pulsed DC, RF, or HiPIMS) methods.

One special feature of ion cleaning methods—which are based on accelerated metal ions (thus ion cleaning most with an applied bias voltage of 500V to 1500V) typically extracted from metal vapors that are not 100% ionized, zirconium in the present disclosure—is that process parameters of this kind can be selected so that a thin zirconium layer in the thickness range of a few nm up to a few 10s of nm forms, which constitutes the zirconium adhesive layer.

Carbon coatings according to the present disclosure can be used to coat substrates composed, for example, of steel, hard metal, aluminum alloys, Cu alloys, ceramic, cermet, or other metallic alloys. Since the coating temperature for the manufacture of carbon coatings according to the present disclosure can be as low as 100° C., it is possible to coat extremely temperature-sensitive substrates in terms of the substrate materials or other properties.

It is possible to coat machining tools and forming tools, for example.

Components such as valve parts and vane pumps, automobile parts such as piston pins, piston rings, cam followers, and bucket tappets, household appliances such as knives, scissors, and razor blades, medical components such as implants and surgical instruments, and decorative parts such as watch cases can, among other things, also be coated with the carbon coating according to the present disclosure.

As a vapor source for the deposition of zirconium layers, it is possible to use arc sources both with and without filters. Likewise, suitable zirconium layers can be deposited by means of sputtering methods such as RF and DC; pulsed DC; or HiPIMS. Vapor deposition methods such as electron beam vapor deposition, low voltage arc vaporization, or hollow cathode arc vaporization are also suitable for depositing the zirconium adhesive layer for the carbon coatings according to the present disclosure.

In addition to a-C coatings and ta-C coatings, it is also possible to selectively manufacture a-C:Me coatings or ta-C:Me coatings. These coatings contain at least one metal as a doping element, unlike the a-C coatings and ta-C coatings which have none, and have altered property profiles, e.g. their electrical conductivity is higher. This can therefore be advantageous in certain applications. Since the adhesive layer according to the present disclosure should be composed of zircon, it would be advantageous from a process standpoint to use zirconium as the Me.

The simplest process control is achieved if the zirconium vaporization is carried out at the same time as the operation of the carbon vaporization by means of arcing. Another method is the use of carbon targets to which zirconium has been added.

Another embodiment according to the present disclosure is hydrogen-free amorphous a-C:X coatings or ta-C:X coatings.

In addition to metallic elements (generally identified as Me) that are added to the coatings and thus result in the a-C:Me coatings, it is also possible to add other non-metallic elements (generally identified as X) as doping elements for layer optimization depending on the application. These non-metallic elements can be nitrogen, boron, silicon, fluorine, or others. For example, doping with N or Si results in a reduction in stress and doping with F results in a change in wetting properties (higher wetting angle), as is generally known to the person skilled in the art.

According to another embodiment of the present disclosure, the hydrogen-free amorphous layer is embodied as a multilayer coating; the multilayer coating structure comprises alternating individual layers of a type A and a type B; and the individual layers of type A consist of a-C or ta-C and the individual layers of type B consist of Me or of a-C:Me or ta-C:Me. In this connection, it is possible, for example, to use zirconium as the Me in such a way that a multilayer coating of type a-C/Zr or ta-C/Zr or a multilayer coating of type a-C/a-C:Zr or ta-C/ta-C:Zr is formed as well as other combinations such as ta-C/a-C:Zr or a-C/ta-C:Zr.

With this method, it is possible to manufacture thicker coatings because overall internal stresses in the layers are reduced. For example, the same procedure is followed as in the exemplary embodiment starting with the phase of the deposition of the metallic layer. The layer thickness is limited to approx. 500 nm, and then the same procedure is followed, for example 6 times, so that in addition to the zirconium adhesive layers, another 5 intermediate layers are produced and a total layer thickness of more than 3 μm is produced. This results in a higher resilience and wear resistance.

According to another embodiment of the present disclosure, the hydrogen-free amorphous layer is embodied as a multilayer coating; the multilayer coating structure comprises alternating individual layers of a type A and a type B; and the individual layers of type A consist of a-C or ta-C and the individual layers of type B consist of a-C:X or ta-C:X. In this connection, it is possible, for example, to use silicon or nitrogen as the X.

It is also possible to use additional arc vaporizers to deposit such layers, which vaporize the graphite cathodes that are alloyed with the X element; other suitable PVD methods could also be used, e.g. sputtering methods, which are used to sputter the element X.

Preferably, the thickness of the individual layers of type A is not more than 2000 nm and not less than 5 nm. It is also preferable for the thickness of the individual layers of type B to be not more than 2000 nm and not less than 5 nm.

In this embodiment, it is also advantageously possible to simultaneously combine a higher layer thickness with an optimized state of stress within the same coating.

According to yet another embodiment of the present disclosure, the Zr coating is applied by means of a metal ion cleaning method to the substrate that is to be coated.

Growth of a zirconium layer can occur at the same time when a bias voltage is used on the substrate in metal ion bombardment by means of zirconium ions in the unfiltered arc, for example of −700 V or less. This can then be used as a zirconium adhesive layer according to the disclosure. In this embodiment, layer thicknesses from 5 to a few 10s of nm are desirable.

According to another preferred embodiment of the present disclosure, the hydrogen-free amorphous layer consists of one layer of a nanocomposite material, which comprises a matrix material and a material embedded in the matrix material; wherein the matrix material preferably consists of a-C or ta-C and the embedded material consists of metallic carbides with dimensions in the nanometer range, e.g. with metal-doped amorphous carbon layers depending on the metal e.g. tungsten carbide (WC), chromium carbides ($Cr_{23}C_6$, $Cr_3C_2$), or other carbides of metallic elements, preferably ZrC.

Figure 2:
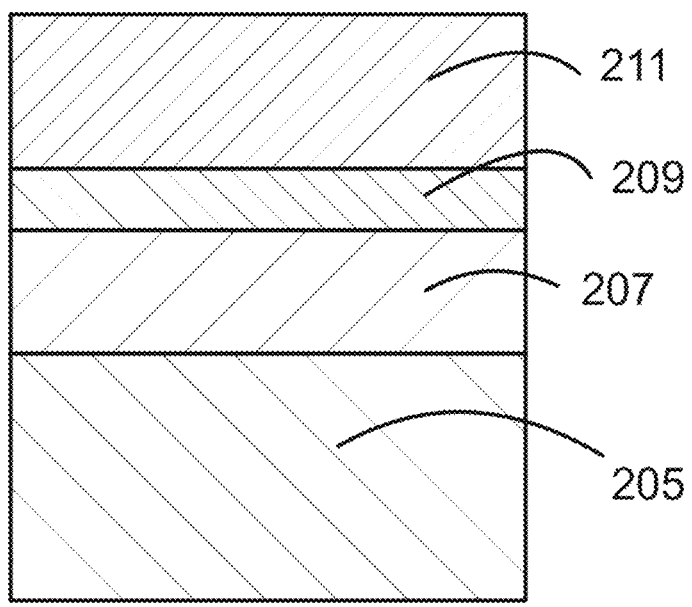
FIG. 2 shows a carbon coating according to the present disclosure with a support layer.

Hard material coatings according to the present disclosure can also comprise support layers between the substrate and the zirconium adhesive layer onto which the hydrogen-free amorphous carbon layer is deposited, as is shown in FIG. 2. The figure shows a substrate 205 on which first a support layer 207, then a Zr-Cx layer 209, and finally a hydrogen-free amorphous carbon layer is provided. This support layer increases the mechanical resilience of the surface. It is preferably composed of a material that has a higher toughness than the hydrogen-free amorphous carbon layers. For example, this support layer can consist of ZrN. Other nitride-containing (e.g. CrN, AlTiN), carbon nitride-containing (e.g. TiCN, ZrNC), carbide-containing (e.g. TiC, CrC), or oxynitride-containing (e.g. CrNO) layers can serve as a support layer for the a-C or ta-C coating. These layers can be deposited by means of arcing or sputtering.

Hard material coatings according to the present disclosure can also be deposited so that they comprise one or more other metallic adhesive layers between the substrate and the adhesive layer consisting of zirconium. For example, one other metallic adhesive layer can be a Cr adhesive layer manufactured by means of metal ion cleaning with Cr ions onto which the zirconium adhesive layer is then deposited.

According to the present disclosure, hard material coatings can also be manufacture using HiPIMS technology. For example, the hydrogen-free amorphous layer and/or the support layer and/or the zirconium adhesive layer and/or the one or more intermediate layers can be deposited by means of a HiPIMS method.

According to one embodiment variant, only the a-C layer is deposited by means of HiPIMS.

According to another embodiment variant, the Zr adhesive layer and the a-C layer are both deposited with HiPIMS.

The advantage of these embodiment variants is the formation of particularly smooth a-C coatings.

According to the present disclosure, hard material coatings can also be manufactured with the aid of a hybrid technology, which combines HiPIMS and arc technology.

For example, the hydrogen-free amorphous layer and/or the support layer can be deposited by means of a hybrid arc/HiPIMS method and the zircon adhesive layer can be deposited by means of an ion cleaning method with Zr ions based on the HiPIMS process. Moreover, a thicker Zr adhesive layer can also be deposited directly with the HiPIMS process.

It is also possible, for example, for the hydrogen-free amorphous layer to be deposited by means of a hybrid arc process, the support layer to be deposited by means of a HiPIMS process or hybrid arc/HiPIMS process, and the Zr adhesive layer to be deposited by means of an ion cleaning method with Zr ions.

These process combinations should be considered as examples of methods for manufacturing the hard material coatings according to the present disclosure and not as a limitation of the possible methods for manufacturing the hard material coatings according to the present disclosure.

Coatings embodied with a zirconium adhesive layer according to the present disclosure are unique when compared to coatings of previous disclosures having a chromium adhesive layer.

The layer depositions of a-C (hardness of approx. 40 GPa) and ta-C coatings (hardnesses of approx. 55 GPa) were produced using a commercial coating system that is equipped with arc vaporizers.

Two coating series were carried out with 6 different processes each, with identical parameter sets for all of the process steps of each individual process. Depending on the coating series, different adhesive layers were deposited on test pieces made of steel, which had a Rockwell hardness of 60 HRC. In previous coating series, the test pieces were provided with chromium adhesive layers by means of arc vaporization before the deposition of the carbon layers. However, in the coating series according to the present disclosure, zirconium adhesive layers were deposited by means of arc vaporization. In the case of the zircon adhesive layers, a deposition was also carried out by means of mechanical droplet filtration, either with a shield placed in front of them or by means of a jalousie device.

The coating steps of the kind that are known to the person skilled in the art disclose that the first step was pumping out to a high vacuum (0.001 Pa), then a heating step was performed taking care to maintain a maximum substrate temperature of approximately 150° C. Next, ion cleaning by means of AEGD process was carried out, after which the arc vaporizers were ignited with Cr or Zr in order to deposit the metallic adhesive layer of approx. 120+/−40 nm. To that end, corresponding pauses were inserted in order not to exceed a maximum temperature of approximately 150° C. In the transition phase to the deposition of the pure carbon layer, the arc vaporizers were ignited with suitable graphite cathodes and a voltage of at least 500 V was applied to the substrates so that a bombardment of the metallic intermediate layer with C ions occurred. Then different parameters were set in order to produce the a-C and ta-C layers; to do so, different transitions to the pure coating phase with regard to a bias gradient were selected, i.e. reducing the applied substrate voltage to lower values, typically less than 100 V, and different pause times in order to set a maximum coating temperature and different substrate voltages during the coating. A layer thickness of approx. 1 μm was deposited onto the test pieces. The different hardnesses in the layers were set through a suitable combination of applied negative bias and effective coating temperature, whose process fields are known to the person skilled in the art, (higher bias voltages of up to 100 V produce higher hardnesses and higher coating temperatures produce lower hardnesses). The results of 6 different coating processes in terms of the parameters with the chromium adhesive layers and zirconium adhesive layers were assessed with regard to the nanohardness and also the quality of the HRC indentation. The hydrogen-free amorphous carbon layers exhibited the same layer hardness both with the Cr adhesive layers and with the Zr adhesive layers.

Despite the use of identical process sequences in all of the numerous retests with chromium arc vaporizers and zirconium arc vaporizers, it surprisingly turned out that the adhesion of the carbon coatings that comprised a zirconium adhesive layer according to the present disclosure were much higher in comparison to the carbon coatings that comprised a chromium adhesive layer according to other references. The adhesion class of both coatings was measured according to the Rockwell C process (HRC process) and is by way of example in FIG. 1. FIG. 1a) shows the photograph of a Rockwell C indentation in a carbon coating with a chromium adhesive layer. FIG. 1b) shows the photograph of a Rockwell C indentation in a carbon coating on a steel component, hardness approximately 60 HRC, with the zirconium adhesive layer according to the present disclosure, deposited under identical process conditions. Regardless of the process control and position in the coating chamber, the Zr adhesive layer produced an excellent adhesion class of HF1 to HF2, whereas with Cr adhesive layers, the adhesion classes were HF2 to HF4.

One possible explanation of the better adhesion strength in the coating with zirconium adhesive layers according to the present disclosure, determined by means of the HRC process, could be that the deposition of the carbon layers onto the chromium adhesive layers can result in the formation of a plurality of carbides and as a result, brittle Cr—C phases can be formed. Contrarily, when using zirconium adhesive layers according to the present disclosure, a more brittle phase does not form, but rather a "more ductile" phase forms, which under certain circumstances, can comprise zirconium monocarbide (ZrC).

Ion cleaning methods must therefore be understood to include all etching methods that achieve a sputtering or implantation effect on the surface through ionization of one or more inert process gases (e.g. helium, neon, or argon) and/or metals and accelerating them at the substrate surface. If these ion cleaning methods are primarily intended for removing impurities such as native oxides or also organic impurities, then it is often sufficient to operate solely with inert gas ions. These processes, like the above-mentioned arc enhanced glow discharge (AEGD) process, are known to the person skilled in the art. If in this connection, the ion cleaning method is carried out with sufficiently high intensity (in a way that can be adjusted for example by means of the strength of the bias voltage) and/or duration, then a sufficient amount of atoms are knocked out from the substrate surface to insure a good layer adhesion in the metal ion cleaning method or coating procedure that takes place after the ion cleaning method.

Analogous to the ion cleaning method of this application—in which in addition to the process gas, or also exclusively, metal ions are used—metal ion cleaning methods (also referred to as metal ion etching) are understood to be a different etching method. In the metal ion cleaning method, one or more metal sources made for example of chromium or zircon are used, which have the effect that ionized metals are accelerated at the substrate surface. Primarily as a function of the strength of the applied bias voltage and the amount of current applied to the metal source, the energy and quantity of the vaporized materials (e.g. in arc processes) or also sputtered materials (e.g. in sputtering or HIPIMS processes) can be selectively adjusted. In addition to a cleaning of the substrate surface by means of the above-mentioned metal ions, it is thus possible for the person skilled in the art to achieve a net deposition on the substrate by means of metal ion bombardment. With a constant vaporization quantity, it is primarily the strength of the applied bias voltage that decides whether a material deposit of the metals used onto the substrate takes place. If even higher bias voltages (above about 700 V) are used, in addition to the cleaning of the substrate surface, the metal ions used are even implanted into the substrate surface, which can happen to depths of several tens of a nm. But depending on the material, with the same process parameters, a net deposition of a few tens of a nm can take place. These methods are sufficiently known to the person skilled in the art, which is why the exemplary embodiments mentioned in this application must not be understood to be limiting to the present disclosure.

In the context of the present disclosure, hydrogen-free amorphous carbon layers are understood to be all carbon layers whose hydrogen content is <5 at %, preferably <2 at %, not including any impurities that are present. But characterizing methods such as elastic recoil detection analysis (ERDA), Rutherford backscattering (RBS), or secondary ion mass spectroscopy (SIMS) that are suitable for determining the chemical composition of the layers according to the present disclosure are known to the person skilled in the art.

The invention claimed is:

1. A carbon (C) coating on a substrate surface, wherein the coating comprises:
   a hard carbon layer and a zirconium (Zr) adhesive layer, wherein the hard carbon layer has a hard, hydrogen-free, amorphous carbon structure and the zirconium adhesive layer consists of zirconium;
   the zirconium adhesive layer is deposited between the substrate surface and the hard carbon layer; and
   a $Zr-C_x$ layer is formed between the zirconium adhesive layer and the hard carbon layer, which comprises atomic bonds between carbon atoms of the hard carbon layer and zirconium atoms of the zirconium adhesive layer and has a layer thickness of 2 atomic layers to 10 atomic layers.

2. The layer system of claim 1, wherein a support layer is deposited between the substrate surface and the zirconium adhesive layer.

3. The layer system of claim 2, wherein the support layer consists of nitrides, carbides and/or oxides comprising at least one element in the group composed of the third, fourth, fifth, or sixth group of the periodic system as well as Aluminum (Al), Silicon (Si), Boron (B), and the group of lanthanoids.

4. The carbon coating of claim 1, wherein the Zr—$C_x$ layer contains zirconium monocarbide.

5. A method for depositing the carbon coating of claim 4, wherein the zirconium monocarbide in the Zr—C layer is formed by means of a simultaneous deposition of zirconium and carbon onto the zirconium adhesive layer.

6. The carbon coating of claim 1, wherein the hydrogen-free amorphous hard carbon layer is comprised of an a-C or ta-C layer.

7. The carbon coating of claim 1, wherein the hydrogen-free amorphous hard carbon layer consists of an a-C and/or ta-C layer.

8. The carbon coating of claim 1, wherein the hydrogen-free amorphous hard carbon layer is comprised of an a-C:Me or ta-C:Me layer and/or consists of an a-C:Me or ta-C:Me layer, where Me is a metallic element or a combination of metallic elements.

9. The carbon coating of claim 1, wherein the hydrogen-free amorphous hard carbon layer comprises an a-C:X or ta-C:X layer and/or consists of an a-C:X or ta-C:X layer, where X is a non-metallic element or a combination of non-metallic elements.

10. The carbon coating of claim 1, wherein,
the hydrogen-free amorphous carbon layer is embodied as a multilayer coating, and the multilayer coating structure comprises alternatingly deposited individual layers of a type A and a type B; and
the individual layers of type A are a-C or ta-C layers.

11. The carbon coating of claim 10, wherein the individual layers of type B are a-C:Me or ta-C:Me or are metallic layers consisting of Me, where Me is a metallic element or a combination of metallic elements.

12. The carbon coating of claim 10, wherein the individual layers of type B are a-C:X or ta-C:X layers, where X is a non-metallic element or a combination of non-metallic elements.

13. The carbon coating of claim 1, wherein,
the hydrogen-free amorphous hard carbon layer is embodied as a multilayer coating structure;
the multilayer coating structure comprises alternatingly deposited individual layers of a type A and a type B; and
the individual layers of type A are a-C:Me or ta-C:Me layers or a-C:X or ta-C:X layers, and the individual layers of type B are metallic layers consisting of Me;
where Me is a metallic element or a combination of metallic elements, and X is a non-metallic element or a combination of non-metallic elements.

14. A method for depositing the carbon coating of claim 1, wherein the hydrogen-free amorphous hard carbon layer is deposited by means of an arc vaporization and/or a filtered arc vaporization and/or a sputtering method.

15. The method of claim 14, wherein the sputtering method is a HiPIMS process.

16. A method for depositing the carbon coating of claim 1, wherein the zirconium adhesive layer is deposited by means of an ion cleaning method with Zr ions or by means of a filtered arc vaporization and/or a sputtering method.

17. The method of claim 16, wherein the sputtering method is a HiPIMS process.

* * * * *